United States Patent
Uehigashi et al.

(10) Patent No.: US 8,669,191 B2
(45) Date of Patent: Mar. 11, 2014

(54) METHOD FOR FORMING NI FILM

(75) Inventors: Toshimitsu Uehigashi, Shizuoka (JP); Yasushi Higuchi, Shizuoka (JP); Michio Ishikawa, Shizuoka (JP); Harunori Ushikawa, Shizuoka (JP); Naoki Hanada, Shizuoka (JP)

(73) Assignee: Ulvac, Inc., Kanagawa (JP)

( * ) Notice: Subject to any disclaimer, the term of this patent is extended or adjusted under 35 U.S.C. 154(b) by 34 days.

(21) Appl. No.: 13/445,450

(22) Filed: Apr. 12, 2012

(65) Prior Publication Data
US 2012/0264310 A1    Oct. 18, 2012

(30) Foreign Application Priority Data

Apr. 13, 2011 (JP) .................................. 2011-089629
Apr. 9, 2012 (JP) .................................. 2012-088167

(51) Int. Cl.
*H01L 21/31*    (2006.01)
*H01L 21/469*    (2006.01)

(52) U.S. Cl.
USPC ..................................... 438/758; 257/E21.24

(58) Field of Classification Search
USPC ...................................... 438/758; 257/E21.24
See application file for complete search history.

(56) References Cited

U.S. PATENT DOCUMENTS

| | | | |
|---|---|---|---|
| 5,215,787 A * | 6/1993 | Homma | 427/248.1 |
| 2002/0011599 A1* | 1/2002 | Motoki et al. | 257/76 |
| 2008/0182408 A1* | 7/2008 | Lee et al. | 438/675 |
| 2009/0166636 A1* | 7/2009 | Park et al. | 257/67 |
| 2011/0306203 A1* | 12/2011 | Dordi et al. | 438/653 |
| 2012/0244701 A1* | 9/2012 | Higuchi et al. | 438/664 |

FOREIGN PATENT DOCUMENTS

| | | |
|---|---|---|
| JP | 2001-203211 A | 7/2001 |
| JP | 2011-063848 A | 3/2011 |
| JP | 2011-066060 A | 3/2011 |
| WO | WO 2011/040385 A1 | 4/2011 |

* cited by examiner

*Primary Examiner* — Phuc Dang
(74) *Attorney, Agent, or Firm* — Arent Fox LLP

(57) ABSTRACT

A method for the formation of an Ni film is herein disclosed, which comprises the steps of maintaining the temperature of an Si substrate at a desired level in a vacuum chamber; introducing, into the vacuum chamber, a nickel alkylamidinate (in this organometal compound, the alkyl group is a member selected from the group consisting of a methyl group, an ethyl group, a butyl group and a propyl group), $H_2$ gas and $NH_3$ gas; and then forming an Ni film according to the CVD technique, wherein the film-forming temperature is set at a level between higher than 280° C. and not higher than 350° C.

11 Claims, 5 Drawing Sheets

METHOD FOR FORMING NI FILM

TECHNICAL FIELD

The present invention relates to a method for forming an Ni film and more particularly to a method for forming an Ni film, which makes use of specific film-forming conditions.

BACKGROUND ART

Recently, the techniques for micronizing semiconductor devices have been advanced and there has been such a remarkable tendency that a semiconductor device has a three-dimensional structure. As a result, there has widely been used a technique which makes use of a silicide film formed on, for instance, the bottoms of trenches and holes, which are formed on or through a substrate, and the side walls thereof. For this reason, the need for the achievement of a high coverage characteristics (step-coverage characteristics) of such a silicide film with respect to these bottoms and sides has also become higher and higher.

As metals for forming such a silicide film, there have conventionally been used, for instance, Ti, Co and Ni. The sputtering technique has conventionally been used as a means for forming films of these metals, but a problem has arisen such that this technique is insufficient in the coverage characteristics of the resulting film with respect to the bottoms and sides of such trenches and holes as the micronization technique has been advanced and that the technique cannot cope with such circumstances.

For this reason, there has been developed a CVD technique in which a film is formed by gasifying a metal compound and introducing the gaseous metal compound into a film-forming apparatus. However, this CVD technique suffers from a variety of problems such that the technique uses an organometallic compound as a source of gaseous metal material and therefore, the resulting film thus formed is contaminated with a large quantity of impurities such as C, N and O, that the presence of such impurities would inhibit the silicide-forming reaction even if the resulting film is subjected to a heat-treatment to form a silicide and that it is difficult to form a silicide film starting from the metal film formed according to this CVD technique as compared with the formation thereof starting from the metal film formed according to the conventional sputtering technique.

In the meantime, a silicide film can be formed simply by the formation of a film according to the CVD technique if the film is formed by the technique at a high temperature (for instance, 500° C.), which permits the direct formation of a silicide film according to this technique, but it would be quite difficult to form a necessary and excellent silicide interface required for the production of, for instance, a semiconductor device. For example, in the case of Ni, an NiSi film permits the formation of an excellent low resistant interface, but a problem arises such that the film-forming process carried out at a high temperature would result in the formation of an undesired $NiSi_2$ film and that it is impossible, for this technique, to form any flat low resistant interface. Moreover, a further problem also arises such that when forming a film at such a high temperature, the film-forming rate is increased, but the rate is determined by the feed of a raw material and accordingly, the resulting film is insufficient in the coverage characteristics.

Furthermore, when a semiconductor device is produced, a metal conductive film (such as a Cu film) is subjected to a hydrogen (or ammonia)-annealing treatment for the purposes of the improvement of the electrical properties of the metal conductive film by the removal of impurities such as carbon and nitrogen present in the resulting conductive film and of the improvement of the adhesion between a primary film and the Cu film (see, for instance, Patent Document 1 specified below). In this connection, such an annealing treatment would permit the reduction of the content of impurities such as carbon and nitrogen present in the film, but it never permits the removal of such impurities as oxygen likewise present in the film. For this reason, there has been desired for the development of an Ni film whose oxygen content is low or which is substantially free of oxygen and a method for forming the same.

PRIOR ART LITERATURE

Patent Literature

Patent Document 1: Japanese Un-Examined Patent Publication No. 2001-203211

DISCLOSURE OF THE INVENTION

Problems that the Invention is to Solve

It is an object of the present invention to solve the aforementioned problems associated with the foregoing conventional techniques and more particularly to provide a method for the formation of an Ni film having desired physical properties and capable of being used in wide variety of applications, by specifying the film-forming conditions such as the film-forming temperature (the substrate temperature), the film-forming pressure, the amounts of reducing gases to be used and the ratio between the amounts of these reducing gases.

Means for the Solution of the Problems

The inventors of this invention have found that, in a method for the formation of an Ni film on the surface of an Si substrate or wafer serving as an underlaying material, a desired Ni film can be formed if the film-forming conditions each are set at a predetermined level, while using a nickel alkylamidinate such as nickel 2-alkylamidinate as an organometal material and a combination of $H_2$ gas and $NH_3$ gas, as a reducing gas, in place of $H_2$ gas which has conventionally been used alone and have thus completed the present invention.

The method for the formation of an Ni film according to the present invention comprises the steps of maintaining the temperature of an Si substrate at a desired level in a vacuum chamber; introducing, into the vacuum chamber, a nickel alkylamidinate (in this organometal compound, the alkyl group is a member selected from the group consisting of a methyl group, an ethyl group, a butyl group and a propyl group), and $H_2$ gas and $NH_3$ gas; and then forming an Ni film according to the CVD technique, wherein the film-forming temperature is set at a level between higher than 280° C. and not higher than 350° C. (280° C.< and 350° C.≥), preferably ranging from 285° C. to 350° C. (285° C.≤ and 350° C.≥).

The film-forming rate increases along with the increase of the film-forming temperature (the substrate temperature), but there may be observed such a tendency that the use of a film-forming temperature of lower than 280° C. results in an increase of the so-called incubation time and the film-forming temperature is preferably higher than 280° C., more preferably not lower than 285° C., and, simultaneously therewith, an increase in the content of impurities such as oxygen and nitrogen mixed in the resulting Ni film, while the use of a film-forming temperature of higher than 350° C. leads to an increase in the content of impurities such as carbon present in the resulting Ni film, although the content of nitrogen in the film is reduced. The incubation time of up to 100 seconds (sec) is in general allowable in a film-forming apparatus for the implementation of the method for forming an Ni film according to the present invention. The term "incubation time" used herein means the period of time at which the thickness of the film becomes zero and which can be determined by drawing a straight line joining the experimental data plotted on the graph showing the relation between the film-forming time period and the thickness of the resulting film to thus determine the desired value through the extrapolation of the line.

In an embodiment of the foregoing method for forming an Ni film according to the present invention, the method is characterized in that the film-forming pressure ranges from 240 to 600 Pa.

The incubation time is reduced along with the increase in the film-forming pressure. In this respect, it would be assumed that the higher the film-forming pressure, the higher the density of the generated Ni nuclei. More specifically, if the film-forming pressure is less than 240 Pa, there is observed such a tendency that the incubation time is extremely high and it takes an increased time period for the formation of a desired film, while if it exceeds 600 Pa, there is observed such a tendency that the resulting Ni film shows abrupt increase in its resistance value. The reason why the resistance value of the film undergoes such an abrupt increase is that the resulting grain boundary is too thick and the scattering possibly observed at the grain boundary becomes predominant.

In another embodiment of the foregoing method for forming an Ni film according to the present invention, the method is characterized in that the rate of the amount of the $H_2$ gas relative to the total amount of the $H_2$ gas and the $NH_3$ gas used satisfies the following relation: $30\% \leq H_2/(H_2+NH_3) \leq 95\%$ as calculated on the basis of the flow rates of these gases.

In the present invention, the thickness of the intended Ni film must be not less than about 15 nm while taking into account the relation between the thickness of the Ni film and the film-forming time period and the resistance value (resistivity) of the resulting Ni film should be not more than about 100 μΩm. In this connection, if the rate of the flow rate of the $H_2$ gas is less than 30%, the thickness of the resulting Ni film is not less than about 15 nm, but the resistivity thereof has such a tendency that it is beyond the level of about 100μΩcm, while if the rate of the $H_2$ gas exceeds 95%, there is observed such a tendency that the resulting film has a thickness of less than about 15 nm and the resistivity of the film has a tendency to exceed a level of about 100μΩcm.

In still another embodiment of the foregoing method for forming an Ni film according to the present invention, the method is characterized in that the nickel alkylamidinate is introduced into the vacuum chamber while it is maintained at a temperature ranging from 90 to 150° C.

This is because if the temperature of the nickel alkylamidinate is less than 100° C., the molecules of the raw material may undergo a coupling reaction between them within the container thereof and the piping through which the raw material is transported from the container to the vacuum chamber, while if the temperature thereof exceeds 150° C., the raw material may cause decomposition within the piping during the transportation thereof.

In a further embodiment of the foregoing method for forming an Ni film according to the present invention, the method is characterized in that the $H_2$ gas and the $NH_3$ gas are used in an amount ranging from 75 to 800 sccm as expressed in terms of the total flow rate of these gases.

This is because if the total flow rate of the $H_2$ gas and the $NH_3$ gas is less than 75 sccm, the amount of these gases is extremely low and it takes too much time for forming a film having a thickness on the order of about 15 nm. In addition, an intended film should be formed while using the lowest possible amounts of these gases in order to form desired films in an industrial scale, from the economical standpoint, although there is not any upper limit with respect to the flow rate thereof. Accordingly, the flow rate thereof is preferably one which permits the formation of a film having a desired thickness within a short period of time, although the flow rate may vary depending on the size of a substrate to be treated or that of the film-forming apparatus (the vacuum chamber) and, for instance, it is not more than 800 sccm. Regarding the upper limit of the flow rate, it may appropriately be increased or reduced, while using a film-forming apparatus such as one used for a small substrate having a diameter φ of less than 300 mm, one used for a substrate having a diameter φ of 300 mm or one used for treating a substrate having a diameter φ of 450 mm, depending on the size of the substrate to be treated.

In a still further embodiment of the foregoing method for forming an Ni film according to the present invention, the method is characterized in that the surface of the Si substrate is pre-treated with $H_2$ gas, $NH_3$ gas or a mixed gas comprising $H_2$ gas and $NH_3$ gas, prior to the formation of a desired Ni film.

The pre-treatment of the surface of the Si substrate with the foregoing gas would permit the increase of the density of generated Ni nuclei.

Effects of the Invention

If an Ni film is formed on the surface of an Si substrate using a combination of $H_2$ gas and $NH_3$ gas, as a reducing gas, in place of the conventionally used reducing gas which comprises $H_2$ gas alone, while setting appropriate film-forming conditions, according to the present invention, the following excellent effects can be obtained: The time required for forming Ni nuclei can be controlled (the nucleus-forming time can be reduced); a desired Ni film can be formed at a low temperature; the growth rate of the film can be controlled; the surface morphology of the resulting film can be improved; the concentration of impurities present in the resulting film can be reduced; and the resistance of the resulting film can be lowered. Furthermore, the use of the present invention likewise permits the improvement of the throughput in the process for the fabrication of semiconductor devices. In addition, the method of the present invention also permits the expansion of the temperature range within which the Ni film can be used, and this in turn permits the application of an Ni film in the microfabrication of fine patterns required for the fabrication of a semiconductor device.

Regarding the foregoing method for the formation of an Ni film, even an Ni film formed by the use of the foregoing reducing gases without any pre-treatment of the surface of the Si substrate can show the foregoing various effects, but if an Ni film is formed on the surface of the Si substrate using the reducing gases after the surface is pre-treated with $H_2$ gas and/or $NH_3$ gas, the aforementioned effects can further be improved. This is because there is such a tendency that if the density of generated Ni nuclei can be increased by the pre-treatment, the time required for the incubation can be reduced.

Furthermore, the method of the present invention permits the formation of an Ni film having high quality according to the CVD technique and the reduction of the thickness of the resulting Ni film. Accordingly, the Ni film prepared by the method of the present invention can be used in an increased number of steps in the production of semiconductor devices.

BRIEF DESCRIPTION OF THE DRAWINGS

FIG. 1 is a graph showing the relation between the film-forming time period (second; sec) and the thickness (nm) of the resulting film observed at various substrate temperatures (film-forming temperature: ° C.), wherein the Ni films are those formed in Example 1 given below. More specifically, FIG. 1A shows the foregoing relation observed when the Ni films are formed at a film-forming pressure of 400 Pa, while

MODE FOR CARRYING OUT THE INVENTION

Figure 1A:
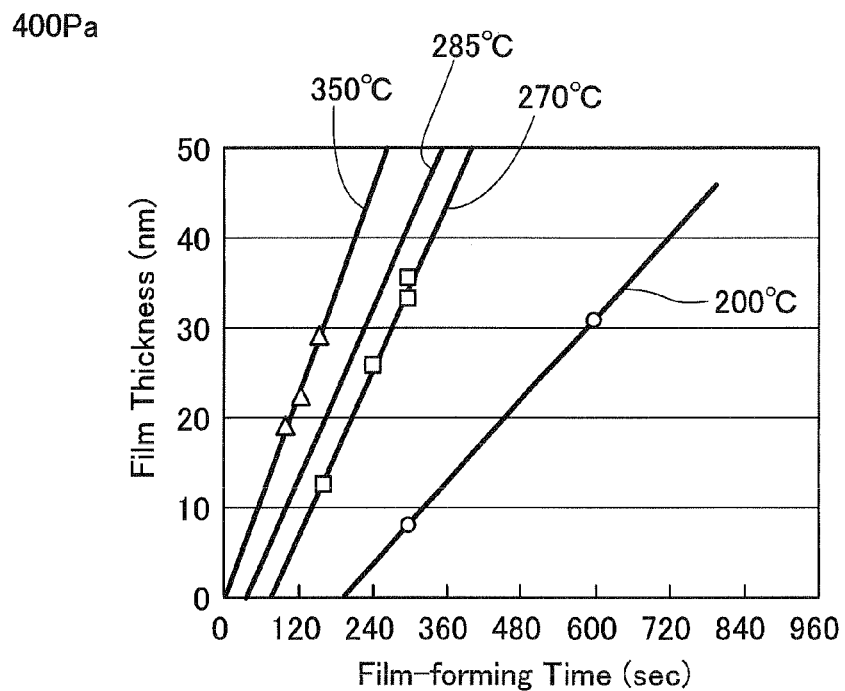

According to an embodiment of the method for the formation of an Ni film, relating to the present invention, this film-forming method is one which comprises the steps of maintaining an Si substrate at a predetermined temperature in a vacuum chamber; introducing, into the vacuum chamber, a nickel alkylamidinate composed of nickel and an alkylamidinate group (wherein the alkyl group is a member selected from the group consisting of a methyl group, an ethyl group, a butyl group such as a n-butyl group, a sec-butyl group and a tert-butyl group and a propyl group such as n-propyl group and i-propyl group) such as nickel 2-alkylamidinate as an organometal material, and a combination of $H_2$ gas and $NH_3$ gas as a reducing gas used for reducing the organometal material to thus form an Ni film according to the CVD technique or the ALD technique and, in this Ni film-forming method, the film-forming temperature (the substrate temperature) is set at a level ranging from higher than 280° C. to not higher than 350° C., preferably ranging from 285° C. to 350° C.; the film-forming pressure is set at a level ranging from 240 to 600 Pa; the rate of the $H_2$ gas present in the gaseous mixture containing $H_2$ gas and $NH_3$ gas as the reducing gas falls within the following range: 30%≤$H_2/(H_2+NH_3)$≤95%, as expressed in terms of the ratio between the flow rates thereof; the nickel alkylamidinate is introduced into the vacuum chamber while the temperature thereof is maintained at a level ranging from 100 to 150° C.; and the reducing gas or the mixture of the $H_2$ gas and $NH_3$ gas, which satisfies the foregoing relation: 30%≤$H_2/(H_2+NH_3)$≤95% is used in a total flow rate ranging from 75 to 800 sccm.

The nickel alkylamidinate used in the present invention is, for instance, represented by the following structural formula:

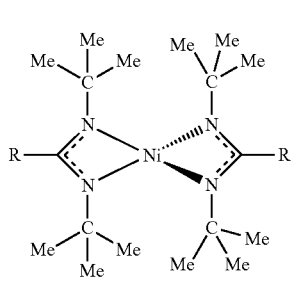

Chemical Formula 1

In the foregoing structural formula, R represents a methyl group, an ethyl group or an isopropyl group and Me represents a methyl group.

The foregoing nickel alkylamidinate may be, for instance, Ni((tert-Bu)$_2$-amd)$_2$(Ni(N,N'-di-tert-butylacetoamidinate)$_2$) and Ni(Bu-Et-Et-amd)$_2$, which can be represented by the foregoing structural formula. In this respect, examples of the alkylamidinate groups include N,N'-methyl-methyl-amidinate, N,N'-ethyl-methyl-amidinate, N,N'-ethyl-ethylamidinate, N,N'-iso-propyl-methyl-amidinate, N,N'-iso-propyl-iso-propylamidinate, and N,N'-tert-butyl-tert-butylamidinate.

The aforementioned ALD technique is an example of the method in which a plurality of raw gases are alternatively supplied to a vacuum chamber to thus form a variety of and a plurality of thin films on the surface of a substrate such as an Si substrate. In this ALD technique, a film is, for instance, formed in a vacuum chamber through the reaction of two kinds of raw gases on the surface of a substrate, which are alternatively supplied to the vacuum chamber in the form of pulses. More specifically, one of the raw gases is first supplied onto the surface of a substrate to thus adsorb the same on the surface of the substrate and then the other raw gas reactive with the former is introduced into the vacuum chamber so that these two gases are brought into contact with one another to thus make them react with one another and to thereby form a desired thin film. In this respect, the first raw gas is adsorbed on the surface of the substrate, then the un-absorbed raw gas is discharged from the vacuum chamber, subsequently the second raw gas is fed to the vacuum chamber to thus make the raw gases react with one another and then the un-reacted second raw gas is discharged from the chamber, a series of these steps being repeated over desired times to thus give a thin film having a predetermined thickness. Such a raw gaseous material may be used in the form of solid, liquid or gas and it is in general supplied along with a carrier gas consisting of an inert gas such as nitrogen gas and argon gas.

Accordingly, the vacuum film-forming apparatus for carrying out such an ALD technique is in general equipped with a substrate-supporting stage provided with a heating means and a means for the introduction of a raw gas positioned at the upper portion of the apparatus in such a manner that it faces the substrate-supporting stage. For instance, there has been known a film-forming apparatus which is so designed that two kinds of raw gases are alternatively fed into the apparatus through a raw gas-introduction means with a desired time lag for the production of a thin film and more specifically, the following two steps are repeatedly carried out over desired times to thus form a thin film having a predetermined thickness: a step for adsorbing the first raw gas onto the surface of a substrate and a step for making the absorbed first raw gas react with the second raw gas.

According to the present invention, an Ni film is formed under specific film-forming conditions while using reducing gases such as those specified above and therefore, the present invention permits the control of the time required for the generation of Ni nuclei; the control of the growth rate of an Ni film; the improvement of the surface morphology of the resulting film; the control of the concentration of impurities present in the resulting film; the formation of a film having a reduced resistance value. For this reason, the method of the present invention can produce an Ni film which can be used as, for instance, an adhesive layer, a silicide layer and a cap layer in the preparation of a fine pattern.

In the present invention, if considering the film-forming rate with respect to the organometal material as one of the raw gases from the viewpoint of the vapor pressure thereof, it is necessary to use the raw gas at a vapor pressure of 200 mTorr. Accordingly, it is preferred to carry out the method for the formation of an Ni film while the temperature of the raw gas is maintained at a level of not less than the temperature which permits the establishment of such a desired vapor pressure of the same, although the temperature of the raw gas may vary depending on the kind of the gas selected. Moreover, the upper limit of the temperature of the raw gas and the piping for transporting the same is preferably not more than 150° C. from the viewpoint of safety.

When using, for instance, a nickel alkylamidinate consisting of Ni ((tert-Bu)$_2$-amd)$_2$ (available from Rohm and Haas Company) as a raw gas, this raw gas is in the solid state at ordinary temperature and has a melting point of 87° C. As one of the characteristic properties thereof, it has a vapor pressure of 200 mTorr at 90° C. For this reason, if considering the film-forming rate from the viewpoint of the vapor pressure, the latter of the raw material should be at least 200 mTorr and the raw gas should thus be maintained at a temperature of not less than 90° C. and preferably not less than 100° C. Furthermore, the piping for the transportation of a raw gas, which extends from the tank for accommodating the raw gas to the vacuum chamber should be maintained at a temperature higher than that of the raw gas. This is because, if the temperature of the piping is lower than that of the raw gas, the latter may undergo liquefaction through condensation during the transportation of the same. On the other hand, it has been said that the thermal stability of this raw gas may be ensured at the utmost 200° C., but Ni contained in, for instance, the piping for the transportation in general has a catalytic action and can serve to lower the decomposition temperature of the raw gas. For this reason, the temperature of the raw gas and the piping for the transportation of the same should be set at a level of not more than 150° C., while taking into consideration the safety.

According to an embodiment of the method for the formation of an Ni film related to the present invention, the surface of an Si substrate may be subjected to a pre-treatment with H$_2$ gas, NH$_3$ gas or a mixed gas composed of H$_2$ gas and NH$_3$ gas, prior to the formation of a desired Ni film, or such a pre-treatment may be omitted. The conditions for such a pre-treatment are not restricted to particular ones and may be known process conditions and it would be sufficient, for the method of the present invention, to carry out the pre-treatment, for instance, at a temperature ranging from about 200 to 350° C. and a film-forming pressure ranging from 100 to 600 Pa.

EXAMPLES

Now, the present invention will be described below in detail with reference to the following Examples, while referring to the accompanying drawings (FIGS. 1 to 7).

Example 1

In this example, an Ni film was formed according to the CVD technique by supplying a nickel alkylamidinate: Ni ((tert-Bu)$_2$-amd)$_2$ (a compound represented by the foregoing general formula (I), in which R is a methyl group (Me); and Bu represents a butyl group) (a product available from Rohm and Haas Company) onto the surface of an Si substrate having a diameter $\phi$ of 300 mm, from which the oxide or natural oxide formed on the surface of the substrate through the natural oxidation had been removed, in a constant flow rate, while using, as reducing gases, 200 sccm or 150 sccm of H$_2$ gas and 200 sccm or 150 sccm of NH$_3$ gas and setting the film-forming pressure at a level of 130 Pa or 400 Pa and setting the film-forming temperature (the substrate temperature) at a level of 200° C., 270° C., 285° C. or 350° C.

In this respect, the Ni films thus formed was inspected for the relation between the film-forming time (second; sec) and the thickness (nm) of the resulting film and the results thus obtained are plotted on FIG. 1A, wherein the relation was observed when Ni films were formed at the respective film-forming temperature (200° C., 270° C., 285° C. and 350° C.) and at the film-forming pressure at a level of 400 Pa, while using H$_2$ gas and NH$_3$ gas in flow rates of 200 sccm and 200 sccm, respectively. The same relation is likewise shown in FIG. 1B, in which the relation was observed when Ni films were formed at the respective film-forming temperature (200° C., 270° C., 285° C. and 350° C.) and at the film-forming pressure at a level of 130 Pa, while using H$_2$ gas and NH$_3$ gas in flow rates of 150 sccm and 150 sccm, respectively.

Figure 1B:
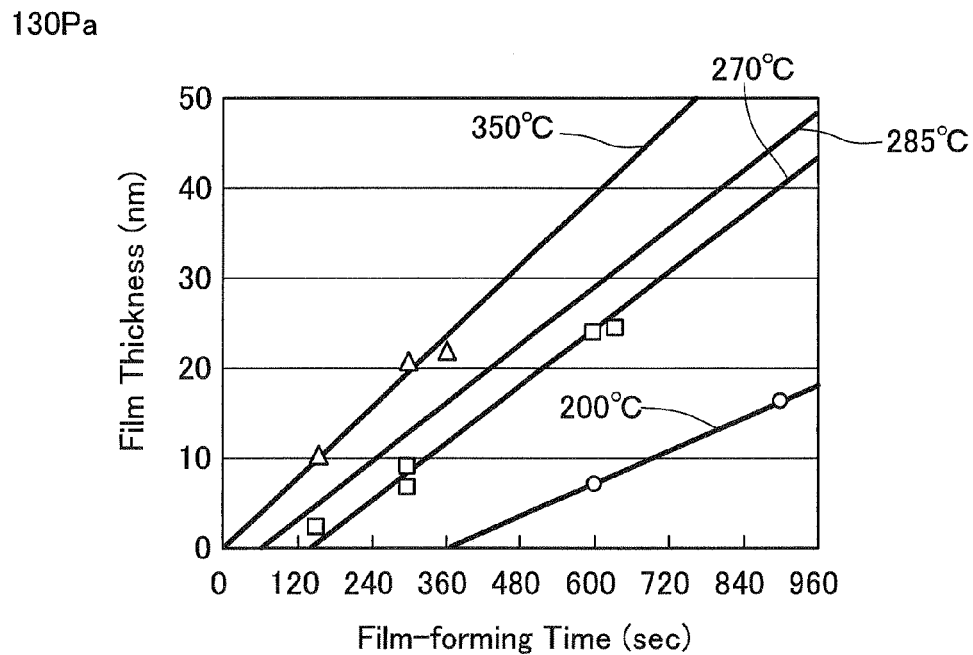
FIG. 1B shows that observed when the Ni films are formed at a film-forming pressure of 130 Pa.

As seen from the data plotted on FIGS. 1A and 1B, the film-forming rate (or the thickness of the resulting film) increases as the substrate temperature selected increases within the temperature range of from 200° C. to 350° C., but the incubation time is increased and it thus takes a long period of time in order to obtain a film having a desired thickness when using a substrate temperature of 200° C. In addition, the foregoing data likewise indicate that the incubation time observed when using a film-forming pressure of 130 Pa is longer than that observed for the film produced using the film-forming pressure of 400 Pa and it takes a longer period of time in order to form a film having a desired thickness, if comparing them at the same substrate temperature. Accordingly, it was found that the incubation time and the desired thickness of the resulting Ni film are well balanced with one another when setting the substrate temperature (the film-forming temperature) during the formation of a film at a level higher than 270° C., preferably between higher than 280° C. and not higher than 350° C. and more preferably ranging from 285° C. to 350° C.

Moreover, the same procedures used above were repeated except for using H$_2$ gas and NH$_3$ gas each in an amount of 150 sccm to form each corresponding film and as a result, the same tendency as shown in FIG. 1A or 1B was likewise observed for these films.

Example 2

In this Example, the nickel alkylamidinate disclosed in Example 1 was used under the same conditions, and the same procedures used in Example 1 were repeated by using $H_2$ gas and $NH_3$ gas as reducing gases in amounts of 200 sccm and 200 sccm, or 150 sccm and 150 sccm; setting the film-forming pressure at 400 Pa; and setting the substrate temperature at 200° C., 270° C., 285° C. or 350° C. to thus form each corresponding Ni film. Each of the resulting films was inspected and evaluated for the concentrations of atomic components included in the resulting Ni film, according to the SIMS technique.

Figure 2:
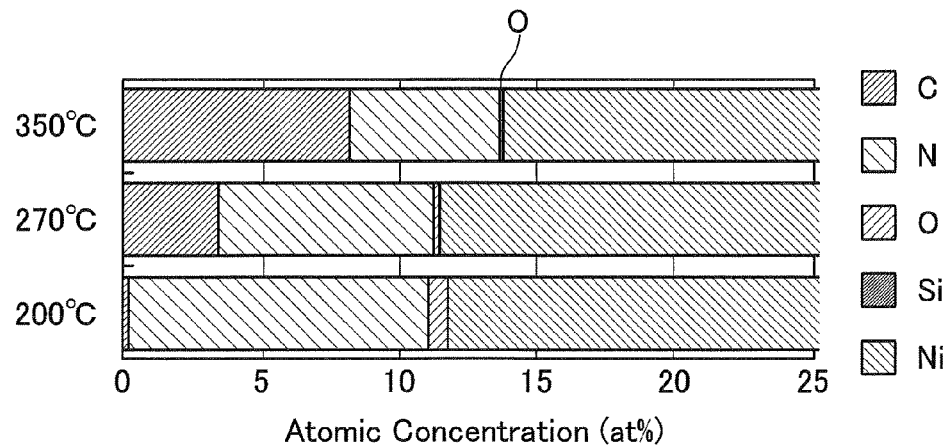
FIG. 2 is a graph showing the relation between the substrate temperature (200° C., 270° C. and 350° C.) and the atomic concentration (at %) of the components present in the resulting film, wherein the Ni films used are those produced in Example 2 given below.

The results thus obtained are shown in FIG. 2. More specifically, FIG. 2 shows the concentrations (at %) of atomic components present in the Ni films produced at the foregoing respective temperatures, while using the $H_2$ gas and the $NH_3$ gas in amounts of 200 sccm and 200 sccm respectively. From the results shown in FIG. 2, it could be recognized that the nitrogen concentration is reduced and the carbon concentration increases as the substrate temperature increases. It is also clear from the same results that the oxygen concentration present in the film produced using the substrate temperature of 200° C. is higher than those observed for the films produced using the substrate temperatures higher than 200° C. In this respect, the contents of the nitrogen and carbon atoms present in the film can be reduced by subjecting the film to an $H_2$ annealing treatment or an $NH_3$ annealing treatment after the formation of the film. For instance, the nitrogen and carbon atoms present in an Ni film can be removed by the annealing of the Ni film using $H_2$ gas at a temperature ranging from 300 to 400° C. and preferably 300 to 350° C. However, the oxygen atoms present in such an Ni film cannot be removed by any post-treatment. Accordingly, it was confirmed that it is desirable to set the lower limit of the substrate temperature at 270° C., preferably higher than 280° C. and more preferably 285° C. On the other hand, if the substrate temperature exceeds 350° C., Ni starts to react with Si to thus form nickel silicide and therefore, it is required for the production of an Ni film to set the upper limit of the substrate temperature at 350° C.

In the meantime, the concentration of Si present in the Ni film produced according to the foregoing method was found to be less than the detection limit.

Moreover, the same procedures used above were repeated except for using $H_2$ gas and $NH_3$ gas each in an amount of 150 sccm to form each corresponding film and as a result, the same tendency as shown in FIG. 2 was observed for the resulting film.

Example 3

In this Example, the nickel alkylamidinate disclosed in Example 1 was used under the same conditions, and the same procedures used in Example 1 were repeated by using $H_2$ gas and $NH_3$ gas as reducing gases in amounts of 200 sccm and 200 sccm, or 150 sccm and 150 sccm, respectively; setting the substrate temperature at 285° C.; and changing the film-forming pressure so that it falls within the range of from about 50 Pa to about 900 Pa to thus form each corresponding Ni film.

Figure 3:
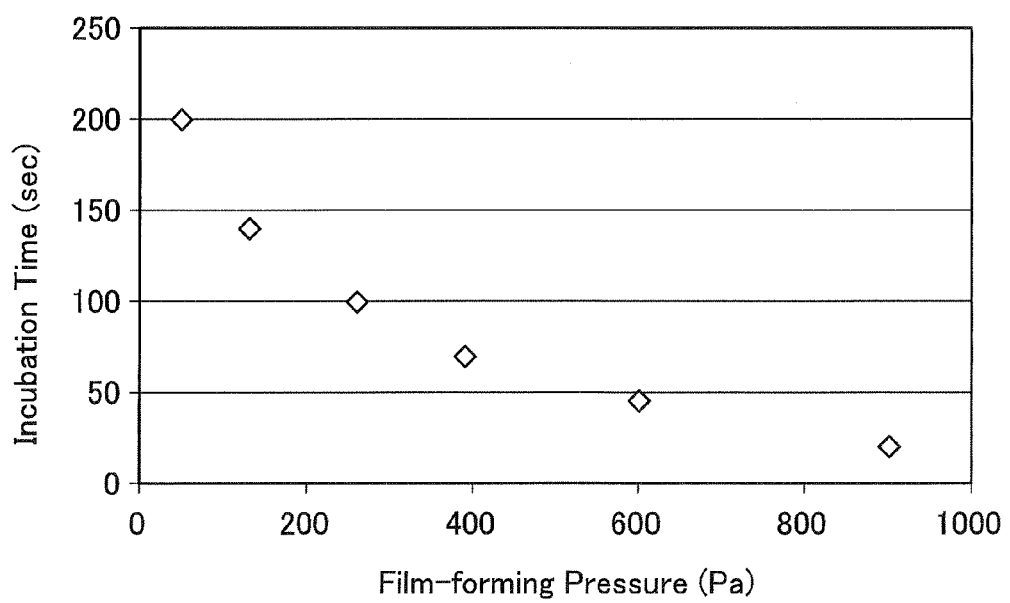
FIG. 3 is a graph showing the relation between the incubation time (second: sec) of a film and the film-forming pressure (Pa) with respect to the Ni films produced in Example 3 given below.

The resulting films were inspected or evaluated for the relation between the film-forming pressure and the incubation time (second; sec), wherein the films were those produced using the $H_2$ gas and the $NH_3$ gas each in an amount (flow rate) of 200 sccm and the substrate temperature of 285° C. and the results thus obtained are plotted on FIG. 3.

As will be seen from the data plotted on FIG. 3, the incubation time is decreased as the film-forming pressure increases. It would be assumed that such a result was obtained since the higher the film-forming pressure, the greater the density of Ni nuclei generated, in the case where an Ni film is produced at a high film-forming pressure. In the film-forming apparatus used in the present invention, up to 100 seconds of incubation time would be permissible. Accordingly, the lower limit of the film-forming pressure is determined to be 240 Pa, as will be clear from the results plotted on FIG. 3.

Moreover, the same procedures used above were repeated except for using $H_2$ gas and $NH_3$ gas each in an amount of 150 sccm to form each corresponding film and as a result, it was found that the same tendency as shown in FIG. 3 is observed for the resulting films.

Example 4

In this Example, the nickel alkylamidinate disclosed in Example 1 was used under the same conditions as in Example 1, and the same procedures used in Example 1 were repeated by using $H_2$ gas and $NH_3$ gas as reducing gases in amounts of 200 sccm and 200 sccm, or 150 sccm and 150 sccm, respectively; setting the substrate temperature at 285° C.; and changing the film-forming pressure so that it falls within the range of from about 50 Pa to about 900 Pa to thus form each corresponding Ni film.

Figure 4:
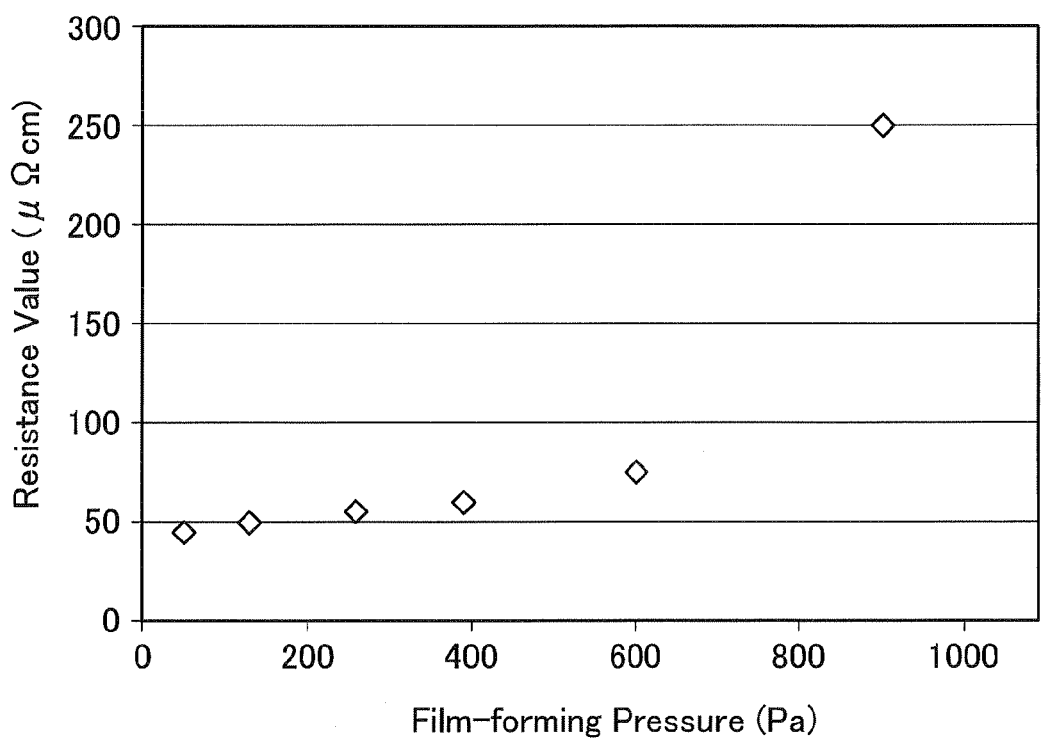
FIG. 4 is a graph showing the relation between the film-forming pressure (Pa) and the resistance value (resistivity: μΩcm), observed for the Ni films produced in Example 4 given later.

The resulting films were inspected or evaluated for the relation between the film-forming pressure and the resistance value (resistivity: μΩcm) of the films, wherein the films herein examined were produced using the $H_2$ gas and the $NH_3$ gas each in an amount (flow rate) of 200 sccm and the substrate temperature of 285° C. and the results thus obtained are plotted on FIG. 4.

As will be clear from the data plotted on FIG. 4, the resistance values of the resulting film show an abrupt increase when the film-forming pressure increases to a level of higher than 600 Pa. This would be because the resulting grain boundary becomes thick and the scattering at the grain boundary becomes predominant. Accordingly, the upper limit of the film-forming pressure is 600 Pa in order to attain the object of the present invention.

Moreover, the same procedures used above were repeated except for using $H_2$ gas and $NH_3$ gas each in an amount of 150 sccm to form each corresponding film and as a result, it was found that the same tendency as shown in FIG. 4 is observed for the resulting films.

Example 5

Figure 5:
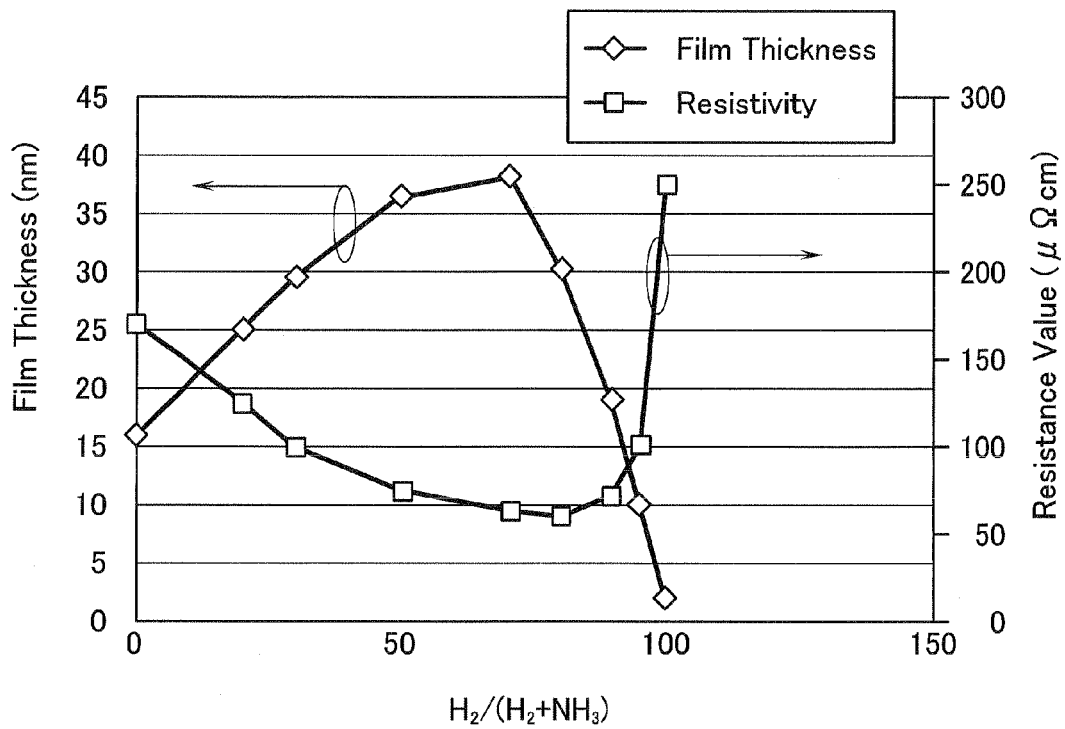
FIG. 5 is a graph showing the relation between the rate of the flow rate of $H_2$ gas relative to the total flow rate of $H_2$ and $NH_3$ gases ($H_2/(H_2+NH_3)$) and the thickness (nm) of the resulting Ni film and between the rate of $H_2$ gas and the resistivity (μΩcm) of the resulting Ni film, wherein the Ni films used are those produced in Example 5 given later.
Figure 6:
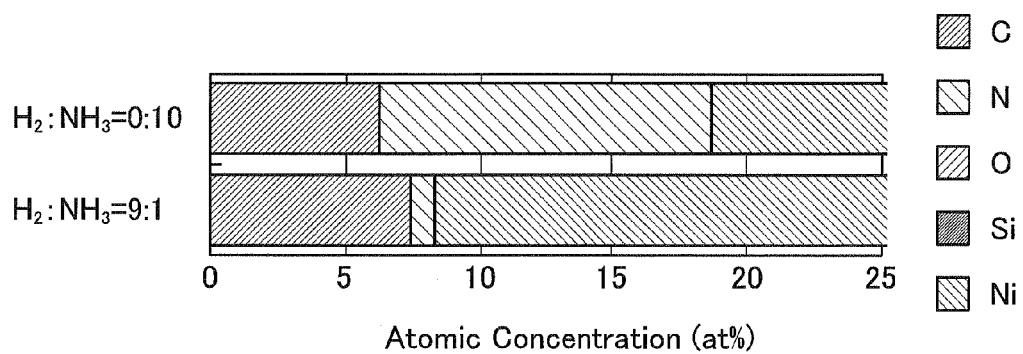
FIG. 6 is a graph showing the relation between the ratio of the flow rate of $H_2$ gas to that of $NH_3$ gas ($H_2:NH_3=0:10$ and 9:1) and the atomic concentration (at %) of the components present in the resulting film, wherein the Ni films used are those produced in Example 5 given later.

In this Example, the nickel alkylamidinate disclosed in Example 1 was used under the same conditions as in Example 1, and the same procedures used in Example 1 were repeated by changing the rate of the flow rate of $H_2$ gas with respect to the total flow rate of $H_2$ gas and $NH_3$ gas ($H_2/(H_2+NH_3)$) used as reducing gases so that the rate falls within the range of from 0% to 100% (provided that the overall flow rate of $H_2+NH_3$ was set at a level of 400 sccm), setting the substrate temperature at 285° C., and setting the film-forming pressure at a level of 400 Pa to thus form each corresponding Ni film. Then the resulting films thus produced were inspected for the relation between the rate of the flow rate of $H_2$ gas and the thickness (nm) of each resulting film or the resistance value (resistivity:

μΩcm) and the results thus obtained are plotted on FIG. 5. Moreover, the same procedures used above were repeated except that the ratio of the flow rate of $H_2$ to that of $NH_3$ was set at 0:10 or 9:1 to thus form each corresponding Ni film and then the atomic concentrations of various atoms present in the resulting film were determined according to the same method used in Example 2 and the results obtained are plotted on FIG. 6.

The data plotted on FIG. 5 clearly indicate that the foregoing procedures hardly form any satisfactory film and the resistance value thereof shows an abrupt increase, when using only $H_2$ gas (100%) as the reducing gas. This clearly indicates that it is necessary to use $NH_3$ for the formation of a film acceptable in the present invention. In the present invention, the resulting film should have the thickness of not less than 15 nm in connection with the film-forming time. Moreover, the resulting film should have a resistivity of not more than 100 μΩ·cm. If synthetically considering the results plotted on FIG. 5 and the requirement for the resistivity, it can be concluded that the lower limit of the rate of the flow rate of $H_2$ gas ($H_2/(H_2+NH_3)$) should be set at 30% and the upper limit thereof should be set at 95% and preferably 92%.

Moreover, when comparing the Ni film produced using a flow rate ratio, $H_2$: $NH_3$, of 0:10 with that produced at a flow rate ratio of 9:1, the carbon concentration observed for the former Ni film is lower than that observed for the latter Ni film and the nitrogen concentration observed for the former Ni film is conversely higher than that observed for the latter Ni film, as will be seen from the data shown in FIG. 6. Regarding the nitrogen concentration, the reason why it is higher in the former Ni film is that only $NH_3$ is used and thus nitrogen may easily be mixed in the resulting Ni film. In addition, it would thus be concluded that the Ni concentration of the resulting Ni film is lower in the former Ni film. In the meantime, the concentrations of oxygen and sulfur possibly present in the resulting Ni film were found to be less than the detection limit.

Example 6

In this Example, the nickel alkylamidinate disclosed in Example 1 was used under the same conditions as in Example 1, and the same procedures used in Example 1 were repeated except that the overall flow rate of the reducing gas consisting of $H_2$ gas and $NH_3$ gas was set at 50, 75, 150, 400 or 800 sccm, provided that the flow rate ratio, $H_2$: $NH_3$, was set at 1:1, that the substrate temperature was set at 285° C., that the film-forming pressure was set at a level of 400 Pa and that the film-forming time period was variously changed to thus form each corresponding Ni film. In this respect, the film-forming pressure was maintained at 400 Pa by the control of the exhaustion speed.

Figure 7:
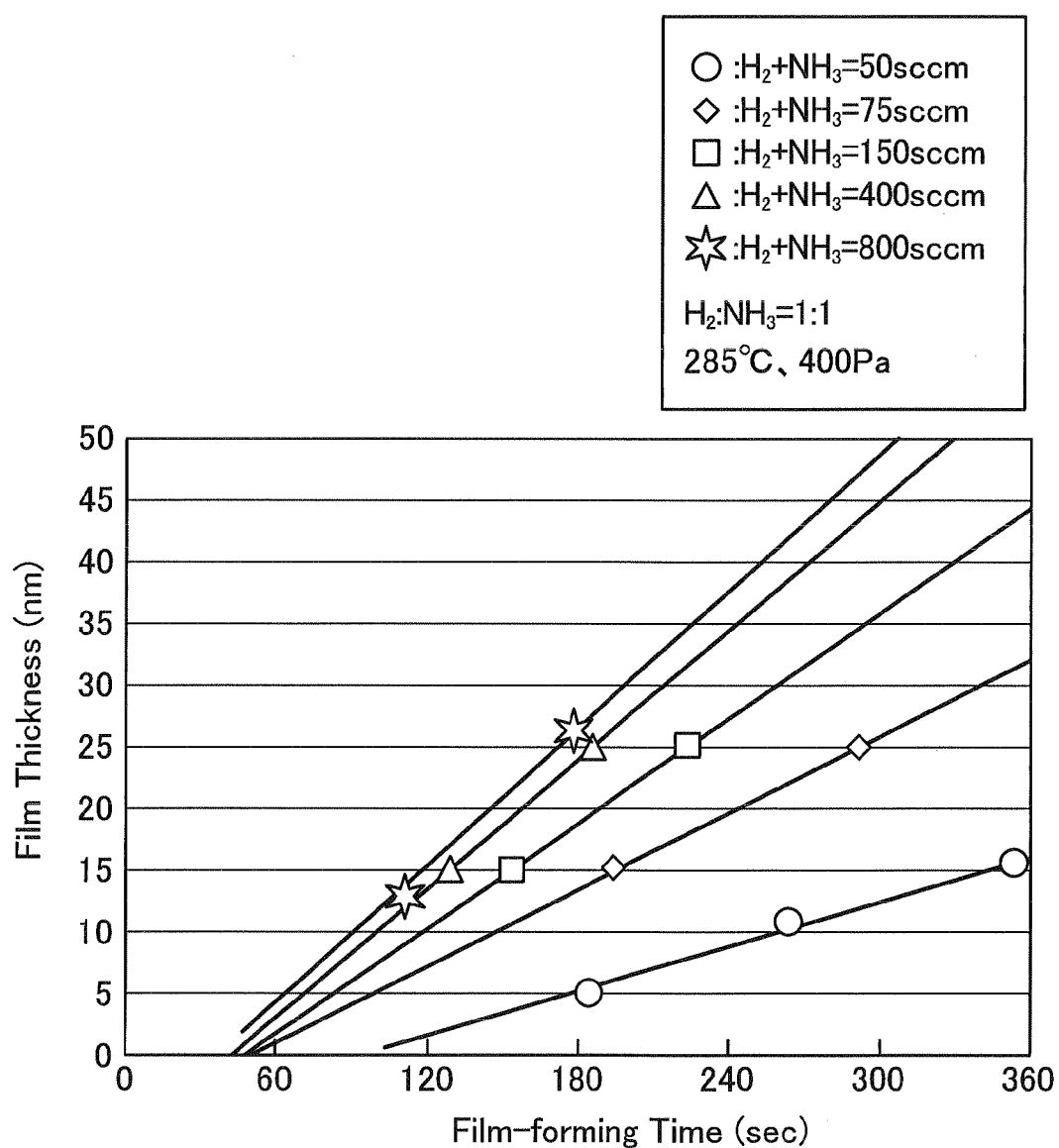
FIG. 7 is a graph showing the relation between the film-forming time period (second: sec) and the film thickness (nm) observed at respective total flow rate (sccm) of $H_2$ gas+$NH_3$ gas and observed for the Ni films produced in Example 6 given later.

The resulting Ni films were examined or evaluated for the relation between the film-forming time (sec) and the thickness (nm) of the resulting Ni film, wherein these films herein examined were produced at the respective overall flow rates of the reducing gas ($H_2$ gas and $NH_3$ gas) specified above and the results thus obtained are plotted on FIG. 7.

The data plotted on FIG. 7 clearly indicate that there is observed such a tendency that the film-forming rate increases as the total flow rate of the reducing gas increases, but it is saturated at a total flow rate of 800 sccm. On the other hand, the incubation time is high in the case where the film is formed using a flow rate of 50 sccm, but the incubation time never shows any considerable change when the films are formed using flow rates other than the foregoing one. From the foregoing, it can be concluded that it is sufficient to set the flow rate of the reducing gas required for the reduction of the raw material at a level of up to about 800 sccm. If the Ni film-forming method according to the present invention is applied to any mass production step, the upper limit of the flow rate of the reducing gas should preferably be set at 800 sccm in the case of an Si substrate of 300 mmφ since it would be desirable that the desired film be produced using the reducing gas in an amount as small as possible, from the economical standpoint. On the other hand, it would be believed that the lower limit of the flow rate of the reducing gas should be set at 75 sccm since the use of the reducing gas in a flow rate of 50 sccm is insufficient while taking into consideration the ability thereof to reduce the raw material. Accordingly, the overall flow rate of the reducing gas consisting of $H_2$ gas and $NH_3$ gas desirably ranges from 75 sccm to 800 sccm.

INDUSTRIAL APPLICABILITY

According to the present invention, if appropriately establishing the film-forming conditions such as the film-forming temperature (the substrate temperature), the film-forming pressure, the amount of the reducing gas to be used, and the relative ratio of the reducing gases used in combination, an Ni film can be formed, which has desired physical properties, and the Ni film thus formed can be used in wide variety of applications and accordingly, the film can widely be employed in the industrial fields such as the semiconductor device-fabricating field.

What is claimed is:

1. A method for forming an Ni film which comprises the steps of maintaining a temperature of an Si substrate at a desired level in a vacuum chamber; introducing, into the vacuum chamber, a nickel alkylamidinate (in this organo-metal compound, the alkyl group is a member selected from the group consisting of a methyl group, an ethyl group, a butyl group and a propyl group), $H_2$ gas and $NH_3$ gas; and then forming an Ni film according to a CVD technique, wherein the film-forming temperature is set at a level between higher than 280° C. and not higher than 350° C., and
   wherein the surface of the Si substrate is pre-treated with $H_2$ gas, $NH_3$ gas or a mixed gas comprising $H_2$ gas and $NH_3$ gas, prior to the formation of an Ni film.

2. The method for forming an Ni film as set forth in claim 1, wherein a film-forming pressure ranges from 240 to 600 Pa.

3. The method for forming an Ni film as set forth in claim 1, wherein the amount of the $H_2$ gas relative to the total amount of the $H_2$ gas and the $NH_3$ gas used satisfies the following relation: $30\% \leq H_2/(H_2+NH_3) \leq 95\%$ as calculated on the basis of the flow rates of these gases.

4. The method for forming an Ni film as set forth in claim 2, wherein the amount of the $H_2$ gas relative to the total amount of the $H_2$ gas and the $NH_3$ gas used satisfies the following relation: $30\% \leq H_2/(H_2+NH_3) \leq 95\%$ as calculated on the basis of the flow rates of these gases.

5. The method for forming an Ni film as set forth in claim 1, wherein the nickel alkylamidinate is introduced into the vacuum chamber while it is maintained at a temperature ranging from 90 to 150° C.

6. The method for forming an Ni film as set forth in claim 2, wherein the nickel alkylamidinate is introduced into the vacuum chamber while it is maintained at a temperature ranging from 90 to 150° C.

7. The method for forming an Ni film as set forth in claim 3, wherein the nickel alkylamidinate is introduced into the vacuum chamber while it is maintained at a temperature ranging from 90 to 150° C.

8. The method for forming an Ni film as set forth in claim 1, wherein the $H_2$ gas and the $NH_3$ gas are used in a flow rate ranging from 75 to 800 sccm as expressed in terms of the total flow rate of these gases.

9. The method for forming an Ni film as set forth in claim 2, wherein the $H_2$ gas and the $NH_3$ gas are used in a flow rate ranging from 75 to 800 sccm as expressed in terms of the total flow rate of these gases.

10. The method for forming an Ni film as set forth in claim 3, wherein the $H_2$ gas and the $NH_3$ gas are used in a flow rate ranging from 75 to 800 sccm as expressed in terms of the total flow rate of these gases.

11. The method for forming an Ni film as set forth in claim 4, wherein the $H_2$ gas and the $NH_3$ gas are used in a flow rate ranging from 75 to 800 sccm as expressed in terms of the total flow rate of these gases.

* * * * *